United States Patent
Bell et al.

(10) Patent No.: US 6,532,270 B1
(45) Date of Patent: Mar. 11, 2003

(54) APPARATUS AND METHOD FOR BROADCAST BAND NOISE REDUCTION IN A TRANSMITTER WITH A LOW IF FREQUENCY

(75) Inventors: Eddy Kent Bell, Round Rock, TX (US); Javier V. Magaña, Austin, TX (US); Stephen T. Janesch, Coopersburg, PA (US)

(73) Assignee: Legerity, Inc., Austin, TX (US)

( * ) Notice: Subject to any disclaimer, the term of this patent is extended or adjusted under 35 U.S.C. 154(b) by 0 days.

(21) Appl. No.: 09/212,903

(22) Filed: Dec. 16, 1998

(51) Int. Cl.[7] .............................. H03C 1/52; H04L 27/04
(52) U.S. Cl. .................... 375/301; 332/170; 455/109
(58) Field of Search ................................. 375/301, 300, 375/260, 261, 268, 285, 296, 298; 370/204, 336, 337, 347, 348, 442, 443; 332/149, 151, 170, 171; 455/108, 109, 118, 119, 113, 114, 116, 296, 104

(56) References Cited

U.S. PATENT DOCUMENTS 4,213,152 A * 7/1980 Kakinuma .................. 348/724
4,310,920 A * 1/1982 Hayes ........................ 370/204
4,994,769 A * 2/1991 Kishi ......................... 332/170
5,548,825 A * 8/1996 Maemura et al. ........... 455/115
5,758,266 A * 5/1998 Kornfeld et al. .............. 455/86

OTHER PUBLICATIONS

Simon Haykin, Analog and Digital Communications, copyright 1989, pp. 370–371.*

* cited by examiner

Primary Examiner—Phuong Phu
(74) Attorney, Agent, or Firm—Zagorin, O'Brien, Graham, LLP

(57) ABSTRACT

In the broadcast band having a plurality of channels allocated therein, by using high-side injection and low-side injection as described herein, the noise introduced into the channel by the local oscillator signal can be minimized. The local oscillator signal in combination with the intermediate frequency determines the frequency of the channel signal being produced by the transmitter. The selected high-or low-side injection determines whether the bulk of the power is introduced into the combination frequency signal (i.e., the channel) above or below the local oscillator frequency, thereby moving the local oscillator frequency outside the broadcast band. The non-selected sideband is even further outside broadcast band.

16 Claims, 5 Drawing Sheets

APPARATUS AND METHOD FOR BROADCAST BAND NOISE REDUCTION IN A TRANSMITTER WITH A LOW IF FREQUENCY

BACKGROUND OF THE INVENTION

1. Field of the Invention

The invention relates generally to communication systems and, more particularly, to time division multiplexed communication systems. This invention has applicability to communication systems operating with bandwidth-limited broadcast spectrums.

2. Description of the Related Art

A typical communication system 10 using time division multiplex techniques is shown in FIG. 1A. An antenna 101 is coupled to a two position switch 102. When the switch 102 is coupled to a first terminal, the signal received by the antenna 101 is applied to low noise amplifier 103. The output signal from the low noise amplifier 103 is applied to mixer unit 104. The mixer unit 104 also receives a signal from the local oscillator unit 105. The signals from the low noise amplifier 103 and the local oscillator unit 105 are combined in mixer unit 104 and applied to filter unit 106. The filtered signal from filter unit 106 is applied to an IF (intermediate frequency) unit 107. The output signal from the IF unit 107 is applied to demodulation unit 108. The demodulation unit 108 recoveries the data (information) that has been encoded in the transmitted signal and applies the data to an output terminal. When the switch unit 102 is in the second position, the output signal from power amplifier is applied to the antenna for transmission of information. The power amplifier 109 receives signals from mixer unit 110. The mixer unit 110 combines signals from the local oscillator unit and from a unit (not shown) that has encoded an intermediate signal with data to be transmitted. Typically, the intermediate frequency is fixed. However, the local oscillator unit 105 has a controllable voltage and can be implemented, for example, by a voltage controlled oscillator. The communication system 10 is multiplexed in that the system is adapted to alternatively receive and transmit signals.

Referring to FIG. 1B, the operation of the duplex mode of the time division multiplexed communication system 10 is illustrated. For purposes of the operation of the time division multiplexed system, time is divided into a series of equal intervals. During alternate intervals, the system is transmitting, i.e., switch 102 has coupled the antenna 101 to the power amplifier 109. During the alternate intervals when the system 10 is not transmitting, the switch 102 couples the antenna 101 to the low noise amplifier 103. During these intervals, the system is in a receiving mode. Thus, the system alternately transmits data and receives data.

The broadcast frequency spectrum is divided into a plurality of a multiplicity of broadcast bands, each band being reserved for a particular purpose. Referring to FIG. 2, a broadcast band ranging from 902 MHz to 928 MHz is used as an example. The broadcast band is divided into channels, 10 channels are shown by way of illustration in FIG. 2. As will be seen from FIG. 2, the transmitted signal will be spread and in fact can overlap the signals of a neighboring channel. Because of this overlap, the signals associated with each channel are offset for purposes of illustration and clarity. The signals in each channel have a central frequency that is a combination of the local oscillator frequency (LO) and the intermediate frequency (IF). However, a noise signal having a frequency of the local oscillator LO will also be broadcast. The noise signal for channel 3, i.e., LO3, is shown in FIG. 2. As can be seen from this illustration, this noise signal can be positioned in the broadcast band and, therefore, can interfere with other information signals being broadcast in the band.

A need has been felt for apparatus and an associated technique that features the reduction of noise signals in the broadcast band resulting from the transmission of a signal having the frequency of the local oscillator. It is another feature of the present technique that it be applicable to all the channels of broadcast band.

SUMMARY OF THE INVENTION

The aforementioned and other features are provided, according to the present invention, by selecting the local oscillator frequency such that the difference between the local oscillator frequency causes a signal with the local oscillator frequency to fall outside of the broadcast band while the carrier signal having a combination of the local oscillator frequency and the intermediate frequency be the designated frequency of the associated channel. In addition to the selection of frequency of the local oscillator, the low-side injection and high-side injection, i.e., the selection of the upper or lower sideband, can be used to determine whether the carrier signal frequency is below or above the local oscillator frequency. By selecting both the local oscillator frequency and the sideband used as the carrier signal, the noise signal generated by the communication within the broadcast band can be reduced.

BRIEF DESCRIPTION OF THE DRAWINGS

The present invention may be better understood, and its numerous objects, features, and advantages made apparent to those skilled in the art by referencing the accompanying drawings.

FIG. 1A is a block diagram of a time division multiplex unit, while

DESCRIPTION OF THE PREFERRED EMBODIMENT(S)

Figure 1A:
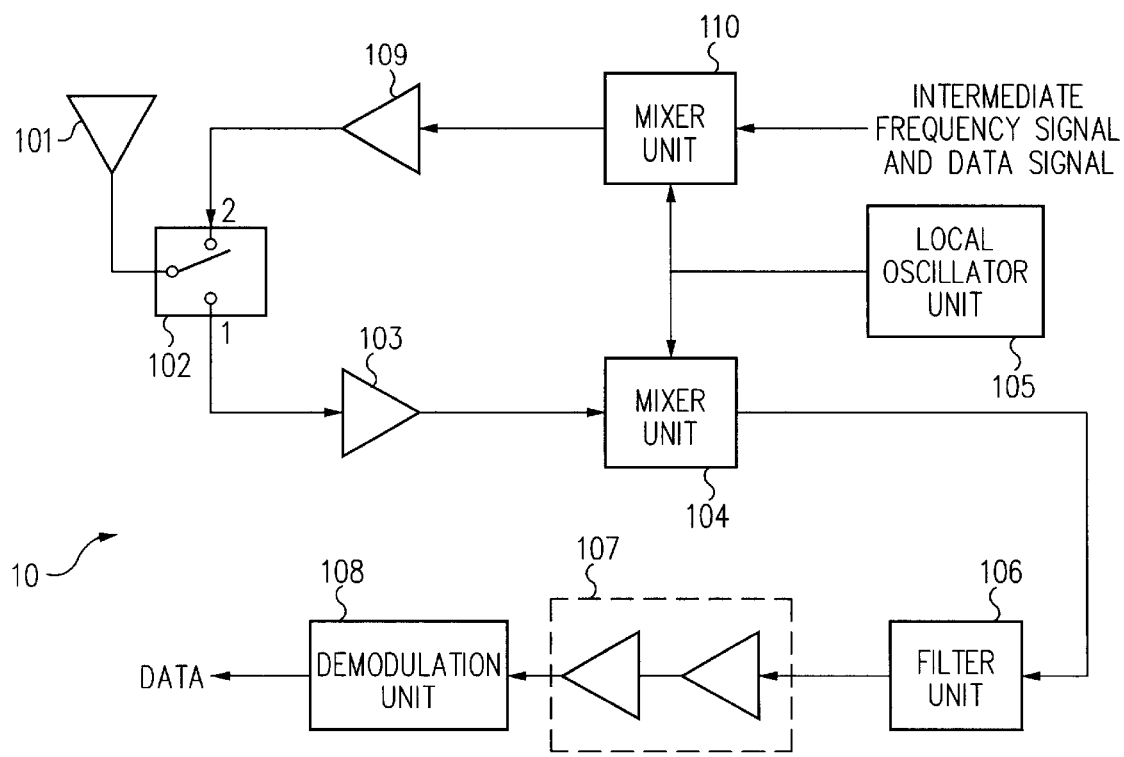
Figure 1B:
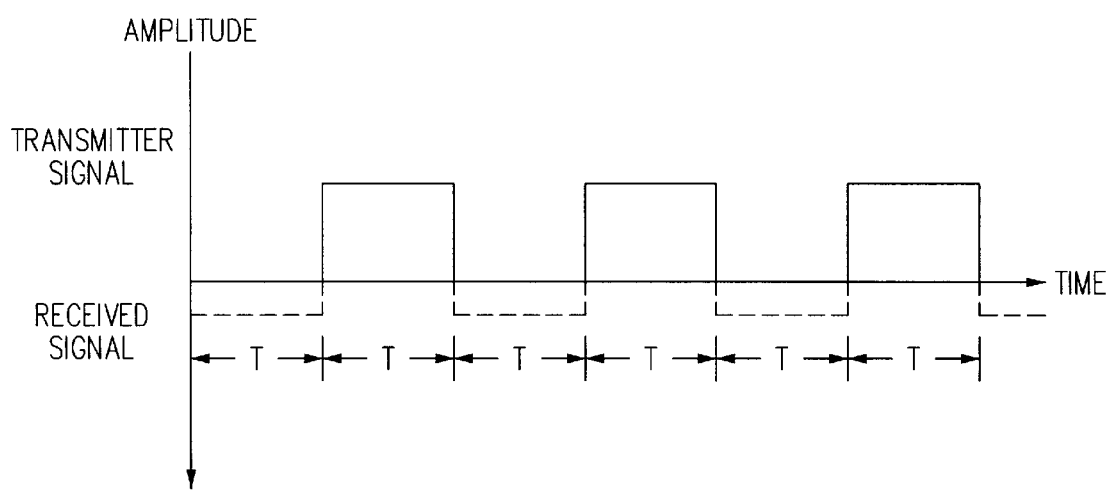
FIG. 1B illustrates the multiplexing of the transmitted and received signal.
Figure 2:
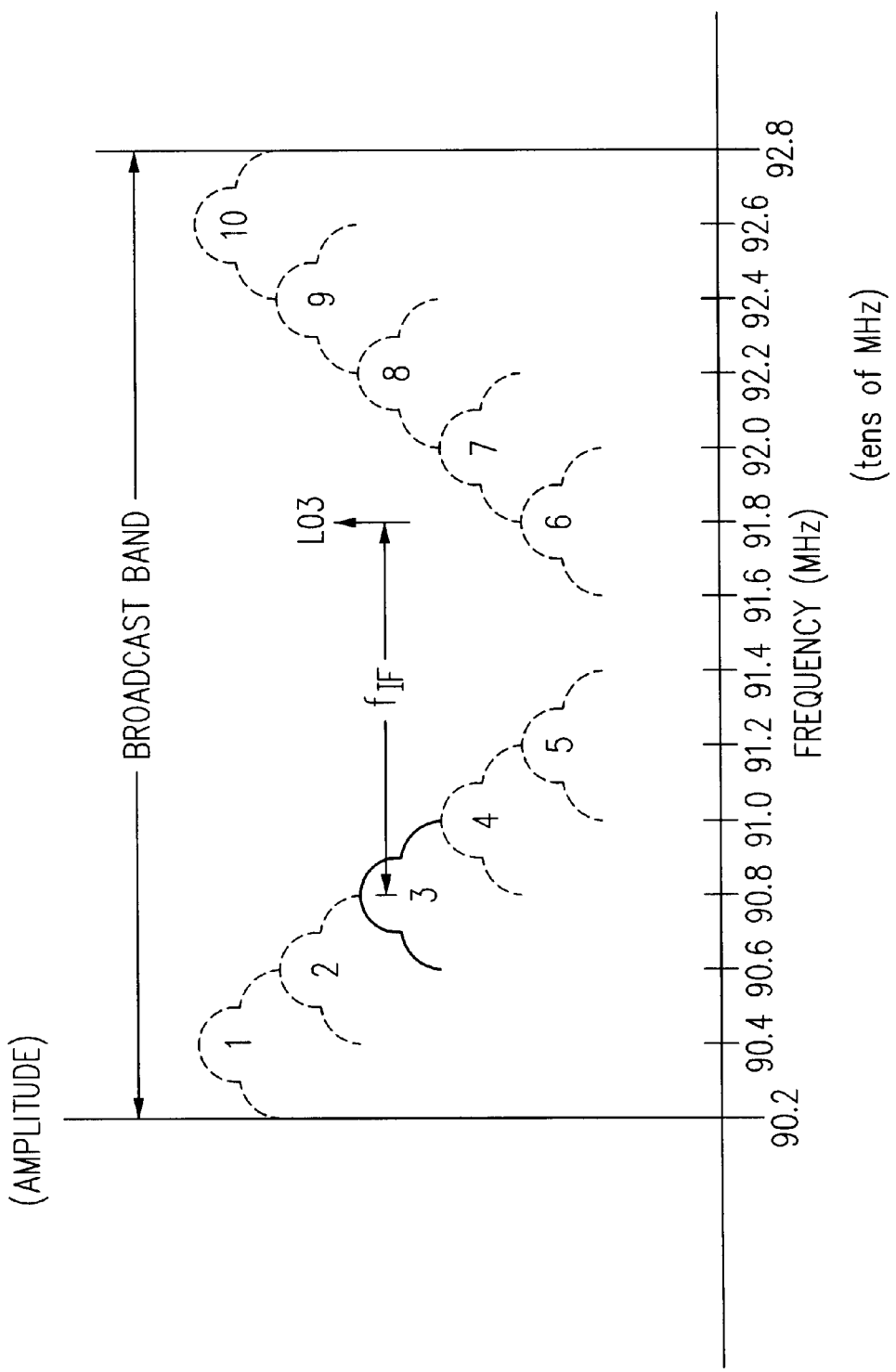
FIG. 2 illustrates the transmission of noise signals within the broadcast band by a communication system transmitting in the broadcast band.

FIG. 1A, FIG. 1B and FIG. 2 have been discussed in relationship to the prior art.

Figure 3:
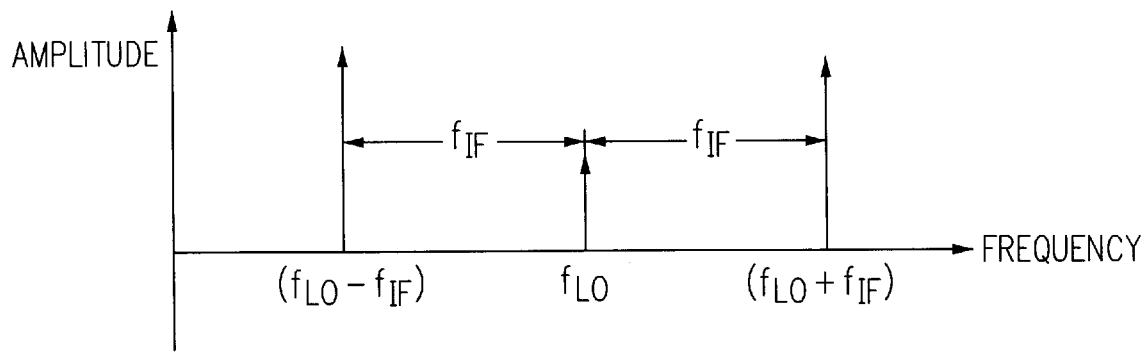
FIG. 3 illustrates the signals generated by a system mixing an intermediate frequency signal with the local oscillator frequency.

The frequency, $f_{TX}$, transmitted by an antenna will, in general, be a combination of three frequencies, the local oscillator frequency $F_{LO}$ plus the intermediate frequency $f_{IF}$, and the local oscillator frequency $F_{LO}$ minus the intermediate frequency $f_{IF}$, and a noise signal component having the local oscillator frequency $f_{LO}$. This signal spectrum is illustrated in FIG. 3. The system can be adjusted so that a majority of the power is transmitted in the side frequencies, i.e., $(f_{LO}-f_{IF})$ and/or $(f_{LO}+f_{IF})$, and a relatively small amount transmitted at the local oscillator frequency $f_{LO}$. For practical reasons, the intermediate frequency $f_{IF}$ is kept constant and the local oscillator frequency $f_{LO}$ varied, e.g., typically by voltage controlled oscillator (VCO). Varying the local oscillator frequency will shift the central frequency of the three principal frequency components. The local oscillator can be used to control the central channel frequency, the central channel frequency being one of the two sideband (non-$f_{LO}$) frequencies.

Figure 4A:
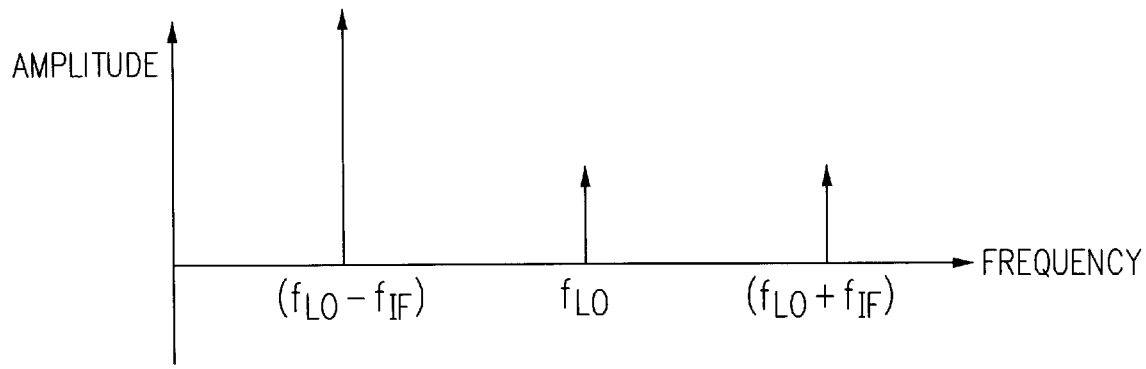
FIG. 4A and FIG. 4B illustrates the effect of high-side injection and low-side injection. (i.e., the upper and lower sideband selection) on the transmitted frequencies shown in FIG. 3 according to the present invention.
Figure 4B:
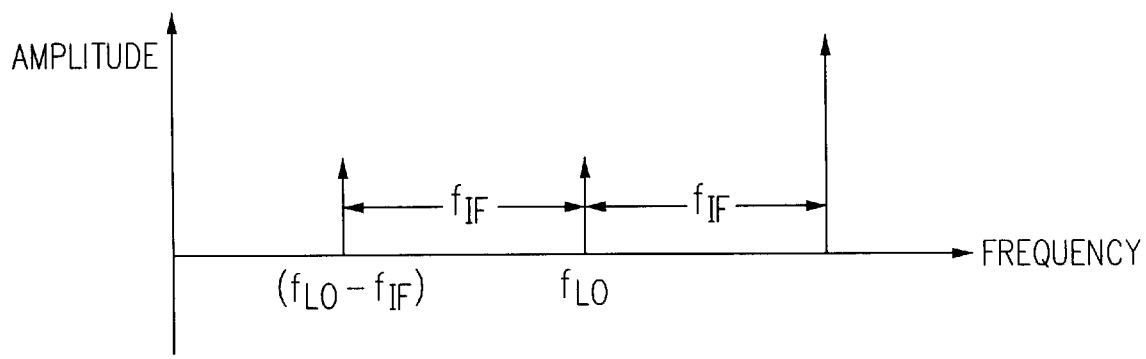

Referring to FIG. 4A and FIG. 4B, a further control of the frequency of the transmitted signal is available. Referring to FIG. 4A, when the transmitting system 10 uses the technique of high-side injection, most of the transmitted power is into the lower or $(f_{LO}-f_{IF})$ radiation component. Referring to FIG. 4B, when the transmitter system 10 uses the technique of low-side injection, the bulk of the transmitted power is channel into the high frequency $(f_{LO}+f_{IF})$ radiation component.

Figure 5:
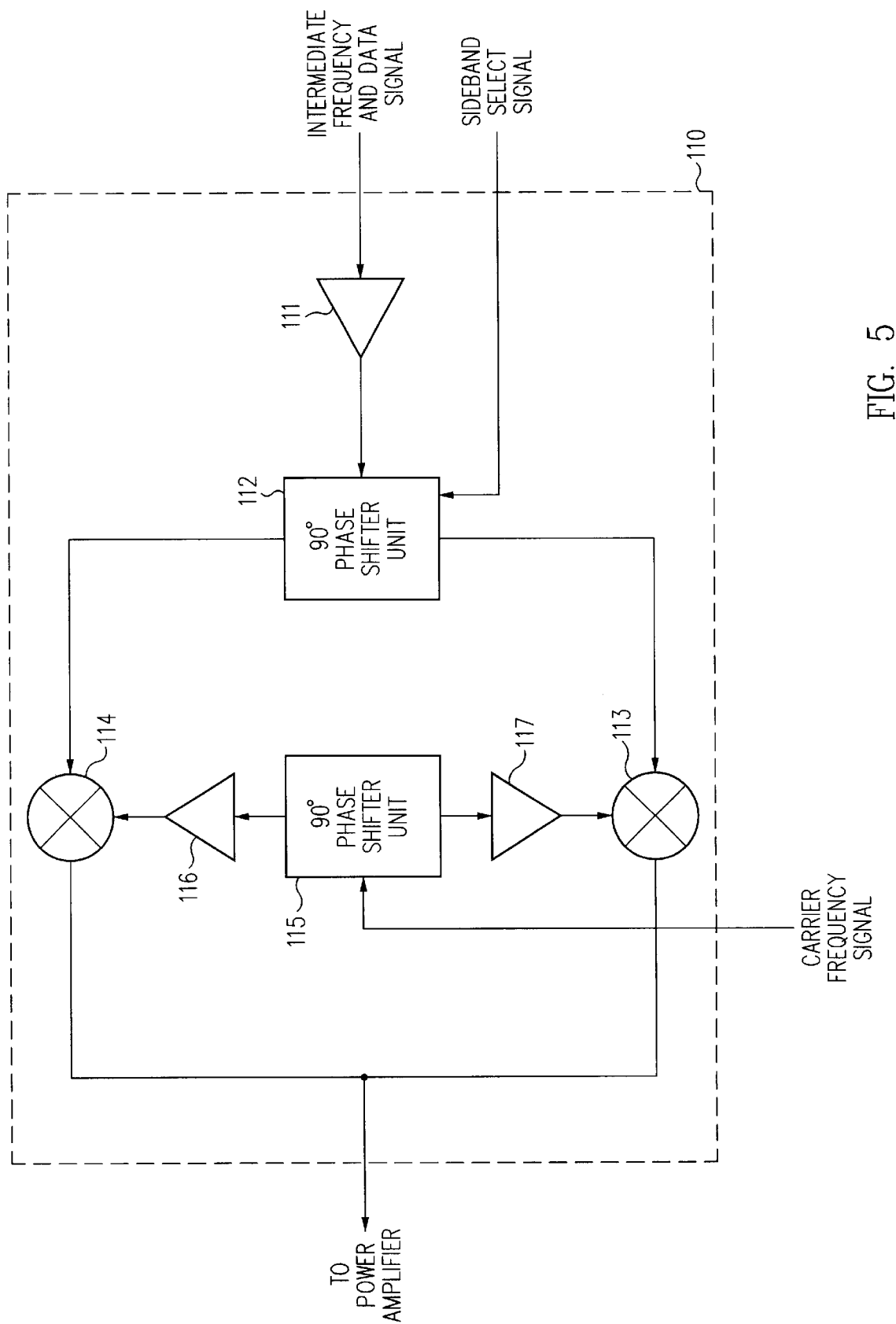
FIG. 5 illustrates apparatus providing high-and low-side injection (i.e., upper and lower sideband selection) of the transmitted frequencies according to the present invention.

Referring next to FIG. 5, a block diagram of a image reject mixer 110 with a selectable sideband is shown. The intermediate frequency and data signal is applied to amplifier 111. The output signal of amplifier 111 is applied to an input terminal if 90° phase shifter unit 112. The 90° phase shifter unit 112 also has a sideband select signal applied thereto. The 90° phase shifter unit 112 applies a first output signal to a first input terminal of mixer unit 113 unit and a second output signal to a first input terminal of mixer unit 114. The local oscillator signal is applied to 90° phase shifter unit 115. A first output signal from 90° phase shifter unit 115 is applied, through amplifier 117, to a second input terminal of mixer unit 113. A second output signal from 90° phase shifter unit 115 is applied through amplifier 116 to a second input terminal of mixer unit 114. The output signal from mixer unit 113 and the output signal from mixer unit 114 are applied to the power amplifier 109. As will be clear to those skilled in the art, the image reject mixer 110 provides a dominant output signal at one of the sideband frequencies, i.e., the local oscillator frequency ± the intermediate frequency. The selection of the upper or the lower sideband is determined by the sideband select signal applied to the 90° phase shifter unit 112. The image reject mixer 110 functions to channel most of the transmitted energy into the selected sideband. However, some energy is transmitted at the local oscillator central frequency, $f_{LO}$, this transmitted energy resulting in a possible contribution to noise in the broadcast band.

Figure 6:
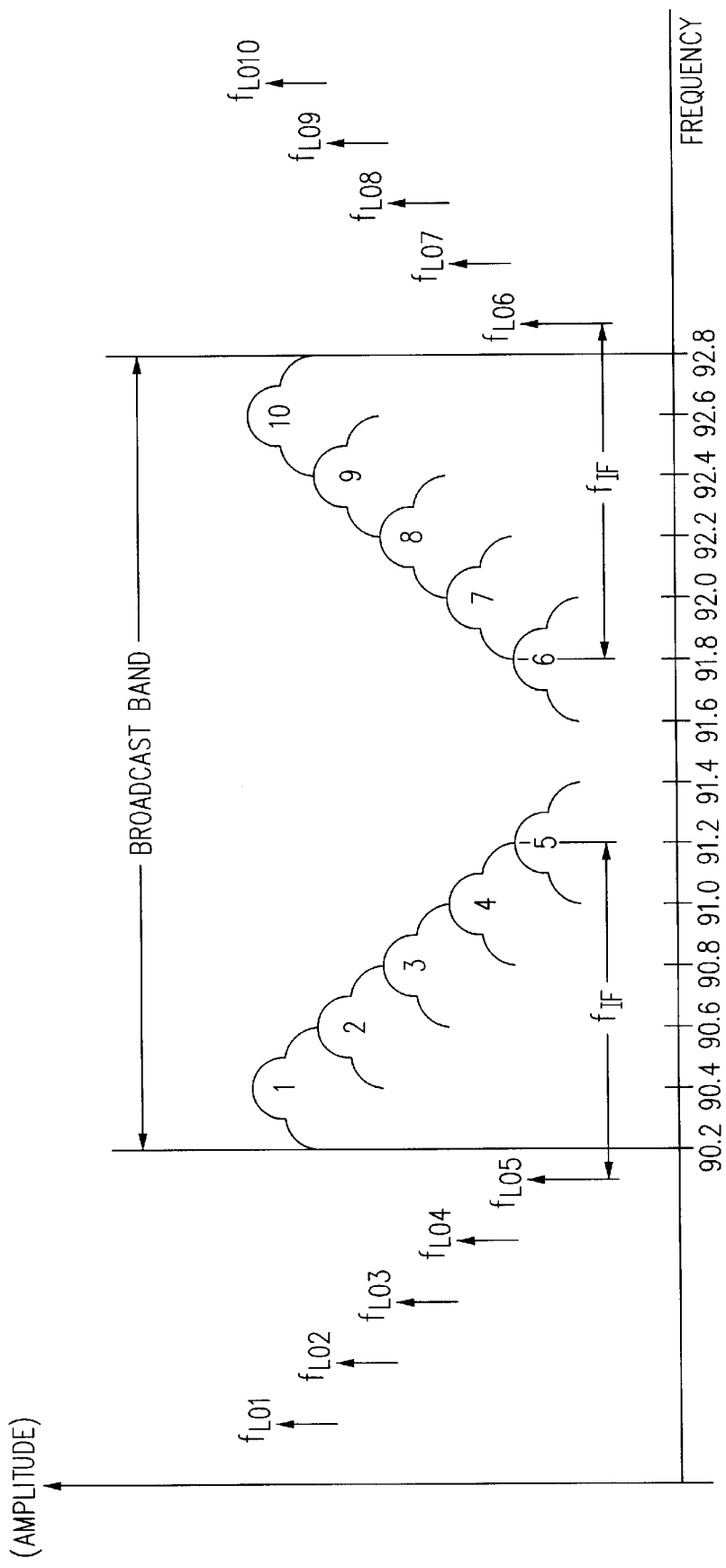
FIG. 6 illustrates how the noise in the broadcast band is reduced according to the present invention. The use of the same reference symbols in different drawings indicates similar or identical items.

Referring to FIG. 6, FIG. 2 is reproduced showing additionally the associated noise ($f_{LO}$) frequency components associated with each signal component. Each channel n has a noise component $f_{LOn}$ associated therewith. However, as illustrated by FIG. 6, by choosing the injection sign, i.e., selecting the appropriate sideband, the signal components into which a bulk of the power has been channeled has the noise component outside of the broadcast band. The signal generated in the non-selected sideband (injection) mode is even further outside of the broadcast band.

Those skilled in the art will readily implement the steps necessary to provide the structures and the methods disclosed herein, and will understand that the process parameters, materials, dimensions, and sequence of steps are given by way of example only and can be varied to achieve the desired structure as well as modifications that are within the scope of the invention. Variations and modifications of the embodiments disclosed herein may be made based on the description set forth herein, without departing from the spirit and scope of the invention as set forth in the following claims.

What is claimed is:

1. A method of reducing the noise generated by local oscillator in broadcast band, the broadcast band having plurality of channels, the method comprising:

modulating a first signal having an intermediate frequency with data signals;

mixing the first signal with a local oscillator signal having a local oscillator frequency, the mixing providing a first sideband signal having a frequency that is the sum of the intermediate frequency signal and the local oscillator signal, the mixing also providing a second sideband signal having second frequency that is the difference between the local oscillator frequency and the intermediate frequency;

selecting the local oscillator frequency subject to the condition that the local oscillator frequency is outside of the broadcast band and subject to the condition that one sideband signal of the first and the second sideband signals has a frequency within the broadcast band.

2. The method as recited in claim 1 further comprising:

allocating a plurality of channels to the broadcast band; and selecting a signal frequency to be associated with a selected channel.

3. The method as recited in claim 2 further comprising the step of injecting a majority of the transmitted energy into the one sideband.

4. The method as recited in claim 3 wherein each channel has one signal associated therewith.

5. The method as recited in claim 4 wherein at least a one channel has a one signal with a local oscillator frequency below the broadcast band, and wherein at least a second channel has a one signal with an associated local oscillator frequency above the broadcast band.

6. The method as recited in claim 5 further comprising providing a one signal for each channel by selecting the local oscillator frequency and by selecting which sideband associated with the local oscillator frequency has a majority of the power injected therein.

7. A communication system for transmitting signals within a broadcast band, the system comprising:

a local oscillator providing a local oscillator signal having a local oscillator frequency;

an intermediate frequency oscillator providing an intermediate frequency signal having a intermediate frequency;

a mixer unit responsive to the local oscillator signal and to the intermediate frequency signal, the mixer unit providing a first signal that has a frequency grater than the frequency of the local oscillator by intermediate frequency and a second signal that has a frequency less than the frequency of the local oscillator by the intermediate frequency, wherein the frequency of the local oscillator is chosen such that one of the first or second signal has a frequency within the broadcast band and the frequency of the local oscillator is outside of the broadcast band, wherein the mixer unit is an image reject mixer unit, wherein the mixer unit provides a majority of the energy in the one of the first and the second signal having a frequency in the broadcast band, wherein the first or the second signal to which a majority of the energy is provided is in response to a control signal applied to the mixer unit, and wherein the broadcast band has a plurality of channels, each channel having a different frequency associated therewith, each channel having a one of the first and the second signals in the broadcast band associated therewith.

8. The system as recited in claim 7 wherein the plurality of channels has at least one channel having a first signal associated therewith and wherein at least one channel has a second signal associated therewith.

9. The system as recited in claim 8 wherein the intermediate frequency signal is modulated to include data to be transmitted.

10. The system as recited in claim 7 wherein the system is a multiplexed transmit/receive communication system.

11. A communication system for transmitting signals in a preselected broadcast band, the system comprising:
   a signal transmitting section, wherein the signal transmitting section includes:
      a local oscillator unit providing a local oscillator signal with a selectable frequency; and
      a mixer unit responsive to the local oscillator signal and an intermediate frequency signal, the mixer unit providing a first signal having a frequency that is the difference between the local oscillator signal frequency and the intermediate frequency signal frequency, the mixer unit providing a second output signal having a frequency that is the sum of the local oscillator frequency and the intermediate frequency signal frequency, the mixer unit responsive to control signals for selecting a one of the first and the second signals, wherein the one signal and the local oscillator frequency are selected such that the one signal has frequency in the broadcast band and the local oscillator signal has a frequency that is outside of the broadcast band.

12. The system as recited in claim 11, wherein the broadcast band has a plurality of channels, each channel having frequency associated therewith, said one signal having a frequency associated with a channel.

13. The system as recited in claim 11 wherein the system can provide a first one signal for a first channel by selecting a local oscillator frequency below the broadcast band and by selecting a first mixer signal, wherein the system can provide a second one signal for a second channel by selecting a local oscillator frequency above the broadcast band and selecting the second mixer signal.

14. The system as recited in claim 13 wherein the system can provide channel frequency signals with a local oscillator frequency below the broadcast band for a first plurality of the channels, and wherein the system can provide channel frequency signals for a second plurality channels with oscillator frequencies above the broadcast band.

15. The system as recited in claim 14 wherein the intermediate signal is modulated data signals.

16. The system as recited in claim 15 wherein the system further includes:
   an antenna;
   a receiving section; and
   a switch coupled to the antenna and to the receiving and transmitting sections, the switch coupling the receiving or the transmitting sections to the antenna in response to control signals.

* * * * *